US007544612B1

United States Patent
Barber

(10) Patent No.: US 7,544,612 B1
(45) Date of Patent: Jun. 9, 2009

(54) METHOD AND STRUCTURE FOR REDUCING THE EFFECT OF VERTICAL STEPS IN PATTERNED LAYERS IN SEMICONDUCTOR STRUCTURES

(75) Inventor: Bradley Barber, Acton, MA (US)

(73) Assignee: Skyworks Solutions, Inc., Woburn, MA (US)

(*) Notice: Subject to any disclaimer, the term of this patent is extended or adjusted under 35 U.S.C. 154(b) by 305 days.

(21) Appl. No.: 11/336,239

(22) Filed: Jan. 20, 2006

(51) Int. Cl.
*H01L 21/302* (2006.01)
(52) U.S. Cl. .................. 438/669; 438/584; 257/758; 257/E21.017
(58) Field of Classification Search ............. 438/435, 438/437, 584, 759, 761, 764, 778, 669; 427/257, 427/282, 286; 257/758, E21.017
See application file for complete search history.

(56) References Cited

U.S. PATENT DOCUMENTS 5,304,505 A * 4/1994 Hazani .................. 438/264
6,420,202 B1   7/2002 Barber et al.
6,496,085 B2  12/2002 Ella et al.
7,235,865 B2 * 6/2007 Juengling ................ 257/635

OTHER PUBLICATIONS

Oguier-Monnier et al. "Reliability Improvement of EEPROm by using WSI@ polycide gate", Microelectronics Reliablity 39 (1999), pp. 897-901.*

* cited by examiner

*Primary Examiner*—Asok K Sarkar
*Assistant Examiner*—Julia Slutsker
(74) *Attorney, Agent, or Firm*—Lowrie, Lando & Anastasi, LLP

(57) ABSTRACT

According to an exemplary embodiment, a method for fabricating a multilayer semiconductor structure includes forming first and second patterned segments, where a first patterned segment sidewall is separated from a second patterned segment sidewall by a first gap; forming a first conformal layer over first and second patterned segments and first gap, where the first conformal layer forms a depression over the first gap; forming a third patterned segment in the depression such that a third patterned segment sidewall is separated from the first patterned segment sidewall by a distance, where the third patterned segment sidewall is separated from a depression sidewall by a second gap; and forming a second conformal layer over the first conformal layer, third patterned segment, and second gap, where a dip is formed in the second conformal layer over the second gap. The distance is controlled so as to reduce a size of the dip.

17 Claims, 4 Drawing Sheets

METHOD AND STRUCTURE FOR REDUCING THE EFFECT OF VERTICAL STEPS IN PATTERNED LAYERS IN SEMICONDUCTOR STRUCTURES

BACKGROUND OF THE INVENTION

1. Field of the Invention

The present invention is generally in the field of semiconductors. More specifically, the invention is in the field of fabrication of multilayer semiconductor structures with patterned and unpatterned layers.

2. Background Art

Bulk acoustic wave technology is rapidly emerging as a desirable technology for the fabrication of radio frequency filters used in today's radio frequency modules. Radio frequency filters based on bulk acoustic wave technology, as well as other semiconductor devices, typically include semiconductor structures having multiple, sequentially deposited layers of different materials. Some of these layers may be patterned using photolithographic and etching processes that are know in the art, while other layers in the structure, such as conformal over-coating layers, are unpatterned.

Depending on materials and patterning processes used, abrupt vertical steps can form in the regions of the semiconductor structure at the edges of the patterned layers. Such abrupt vertical steps can introduce undesirable effects in the semiconductor structures, such as high stress points, which are prone to cracking or delamination, voids in subsequent layers, mechanical discontinuities, which can cause undesirable oscillations in the structure, or pinch points in metal interconnect layers formed over the vertical steps. The vertical steps can be reduced by using complicated processes that involve backfilling of the voids left by the patterning process and/or using overcoating and polishing processes to eliminate the steps. However, such complex processes undesirably increase manufacturing cost.

Thus, there is a need in the art for a cost-effective method of reducing the effect of abrupt vertical steps in multi-layered stacks of patterned and unpatterned layers in semiconductor structures.

SUMMARY OF THE INVENTION

The present invention is directed to a method and structure for reducing the effect of a vertical step in patterned layers in semiconductor structures. The present invention addresses and resolves the need in the art for a cost-effective method of reducing the effect of vertical steps in multi-layered stacks of patterned and unpatterned layers in semiconductor structures. The general approach involves using proximity of multiple abrupt edges and a subsequent over-coating layer. The geometry of a gap left between multiple edges determines the resulting profile of an over-coating layer and can be advantageously engineered to reduce the severity of the steps. The proximal edges may have resulted by strategically aligning edges occurring on different layers in a multilevel configuration or by defining a pattern on one layer that contains proximal edges.

According to an exemplary embodiment, a method for fabricating a multilayer semiconductor structure includes forming first and second patterned segments, where a sidewall of the first patterned segment is separated from a sidewall of the second patterned segment by a first gap. For example, the first and second patterned segments may be a metal, such as tungsten. The method further includes forming a first conformal layer over the first and second patterned segments and the first gap, where the first conformal layer forms a depression over the first gap. For example, the first conformal layer may be a dielectric material, such as silicon oxide. The method further includes forming a third patterned segment in the depression such that a sidewall of the third patterned segment is separated from the sidewall of the first patterned segment by a distance, where the sidewall of the third patterned segment is separated from a sidewall of the depression by a second gap. For example, the third patterned segment may be a metal, such as tungsten.

According to this embodiment, the method further includes forming a second conformal layer over the first conformal layer, the third patterned segment, and the second gap, where a dip is formed in the second conformal layer over the second gap. For example, the second conformal layer may be a dielectric material, such as silicon oxide. The distance is controlled so as to reduce a size of the dip in the second conformal layer. The third patterned segment is formed such that the distance is less than or equal to a thickness of a sum of the first and second conformal layers. The width of the second gap determines the size of the dip in the second conformal layer, where the width of the second gap is controlled by controlling the distance. Other embodiments, features and advantages of the present invention will become more readily apparent to those of ordinary skill in the art after reviewing the following detailed description and accompanying drawings.

DETAILED DESCRIPTION OF THE INVENTION

The present invention is directed to a method and structure for reducing the effect of vertical steps in patterned layers in semiconductor structures. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings. It should be noted that similar numerals generally refer to similar elements in the various drawings.

Figure 1:
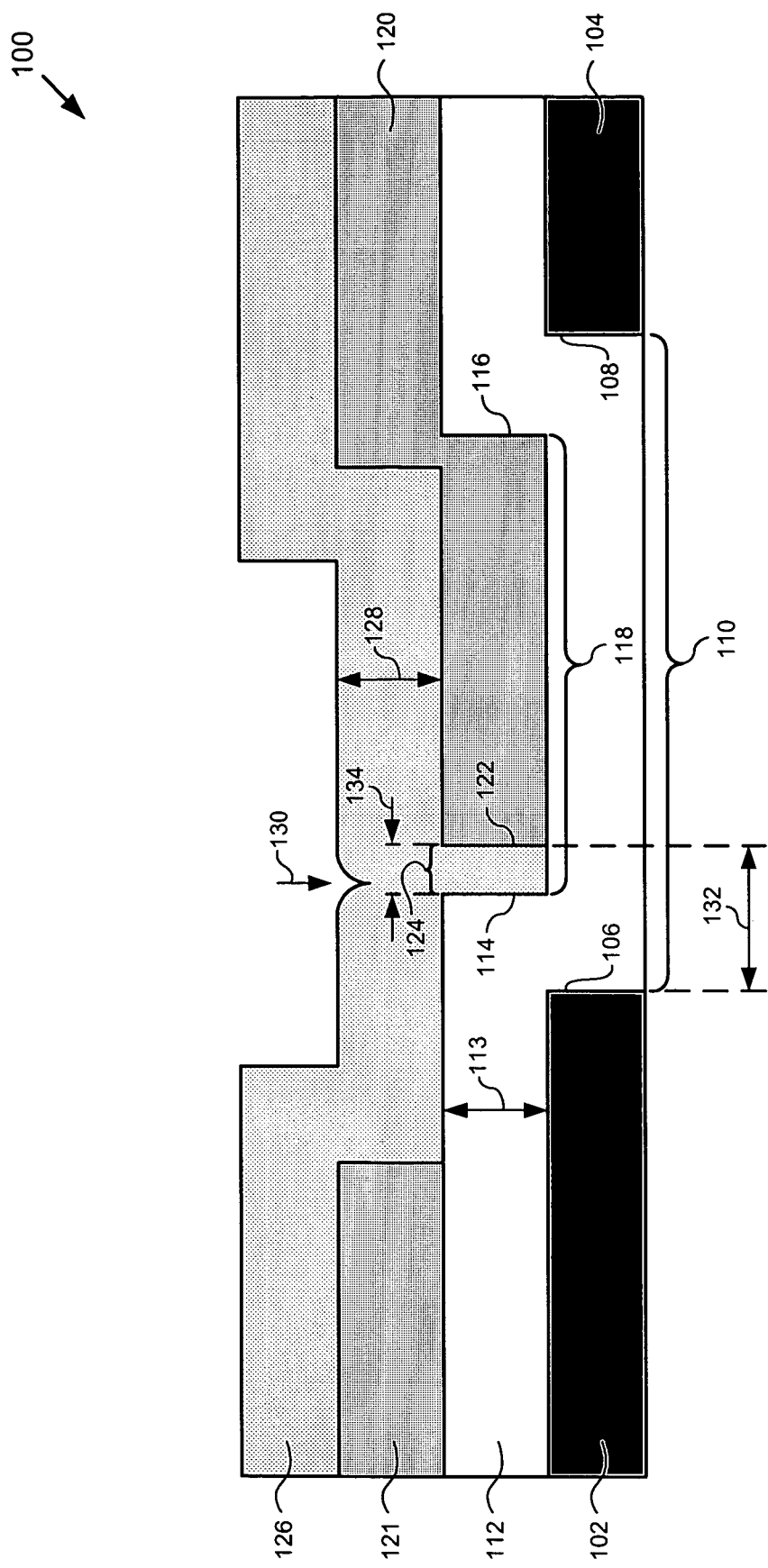
FIG. 1 illustrates a cross-sectional view of an exemplary semiconductor structure in accordance with one embodiment of the present invention.

FIG. 1 shows a cross-sectional view of structure 100 in accordance with one embodiment of the present invention.

Structure 100 includes patterned segments 102, 104, 120, and 121, and conformal layers 112 and 126. Structure 100 can be, for example, a semiconductor structure in a bulk acoustic wave device.

As shown in FIG. 1, patterned segments 102 and 104 are situated over a semiconductor substrate (not shown in FIG. 1) such that sidewall 106 of patterned segment 102 is separated from sidewall 108 of patterned segment 104 by gap 110. Patterned segments 102 and 104 can comprise a metal, such as tungsten or other suitable metal. Patterned segments 102 and 104 can be formed, for example, by depositing a layer of metal by using a physical vapor deposition (PVD) process or other suitable deposition processes. The layer of metal can then be patterned by using a photolithographic process and a suitable etch process, such as a dry etch process.

Also shown in FIG. 1, conformal layer 112 is situated over patterned segments 102 and 104 and situated in gap 110. As shown in FIG. 1, depression 118, which has sidewalls 114 and 116, is situated in conformal layer 112. Conformal layer 112 can comprise silicon oxide or other suitable dielectric material and has thickness 113. Conformal layer 112 can be formed, for example, by conformally depositing a layer of silicon oxide over patterned segments 102 and 104 and gap 110 by using a chemical vapor deposition (CVD) process or other suitable deposition processes.

Depression 118 is formed in conformal layer 112 as a result of the conformal deposition of the silicon oxide layer over gap 110. Further shown in FIG. 1, patterned segments 120 and 121 are situated over conformal layer 112. A portion of patterned segment 120 is situated in depression 118 such that sidewall 122 of patterned segment 120 is separated from sidewall 114 of depression 118 by gap 124. Patterned segments 120 and 121 can comprise a metal, such as tungsten or other suitable metal. Patterned segments 120 and 121 can be formed, for example, by depositing a layer of metal by using a PVD process or other suitable deposition processes. The layer of metal can then be patterned by using a photolithographic process and a suitable etch process, such as a dry etch process.

Also shown in FIG. 1, conformal layer 126 is situated over conformal layer 112 and patterned segments 120 and 121 and situated in gap 124. Conformal layer 126 has thickness 128 and includes dip 130, which is situated over gap 124. Conformal layer 126 can comprise, for example, silicon oxide or other suitable dielectric material. Conformal layer 126 can be formed by conformally depositing a layer of silicon oxide over patterned segments 120 and 121 and conformal layer 112 and in gap 124. The layer of silicon oxide can be conformally deposited by using a CVD process or other suitable deposition processes. Dip 130 is formed in conformal layer 126 as a result of the conformal deposition of the silicon oxide layer over gap 134.

As seen in FIG. 1, sidewall 106 of patterned segment 102 forms a vertical step in structure 100. The invention significantly reduces the effect of the vertical step on layers formed over the vertical step by appropriately controlling distance 132, which represents the distance between sidewall 106 of patterned segment 102 and sidewall 122 of patterned segment 120. By forming patterned segment 120 in depression 118 such that distance 132 is less than or equal to thickness 128 of conformal layer 126 plus thickness 113 of conformal layer 112, width 134 of gap 124 is also controlled. Since width 134 of gap 124 determines the size of dip 130 in conformal layer 126, by controlling distance 132, the size of dip 130 can be controlled. The size of dip 130, which is formed as a result of the vertical step formed by sidewall 106 of patterned segment 102, can undesirably affect the formation and topography of layers of structure 100 that are subsequently formed over dip 130. Thus, by forming patterned segment 120 in depression 118 such that distance 132 is less than or equal to thickness 128 of conformal layer 126 plus thickness 113 of conformal layer 112, the size of dip 130 can be controlled so as to reduce the undesirably effect of dip 130 on subsequently formed layers in structure 100. Thus, by controlling the distance between a vertical step caused by a first patterned segment and a sidewall of a second patterned segment formed over the first patterned segment in a semiconductor structure, the embodiment of the present invention in FIG. 1 can advantageously reduce an undesirable effect of the vertical step in a semiconductor structure.

Figure 2:
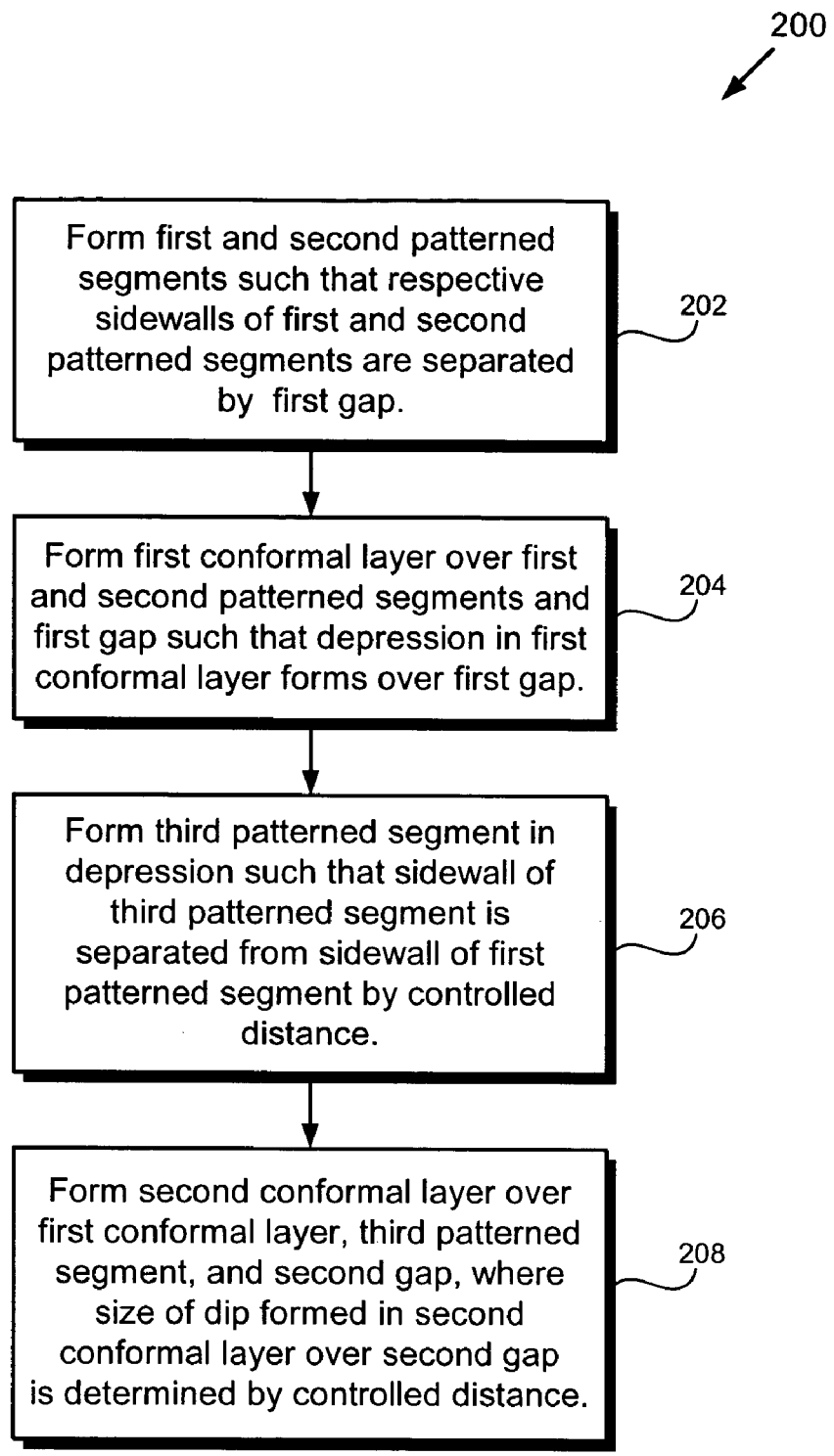
FIG. 2 shows a flowchart illustrating the steps taken to implement an embodiment of the present invention.

FIG. 2 shows a flowchart illustrating an exemplary method according to one embodiment of the present invention. Certain details and features have been left out of flowchart 200 that are apparent to a person of ordinary skill in the art. For example, a step may consist of one or more substeps or may involve specialized equipment or materials, as known in the art.

At step 202 of flowchart 200, patterned segments 102 and 104 in structure 100 in FIG. 1 are formed such that sidewall 106 of patterned segment 102 and sidewall 108 of patterned segment 104 are separated by gap 110. For example, patterned segments 102 and 104 can be formed by appropriately depositing, patterning, and etching a layer of metal, such as tungsten. At step 204, conformal layer 112 is formed over patterned segments 102 and 104 and gap 110 such that depression 118 is formed in conformal layer 112 over gap 110. Conformal layer 112 can comprise silicon oxide, for example, and can be formed by conformally depositing a layer of silicon oxide by using a CVD process or other suitable deposition processes. Depression 118 is formed as a result of conformally depositing the layer of silicon oxide over gap 110.

At step 206, patterned segment 120 is formed in depression 118 such that sidewall 122 of patterned segment 120 is separated from sidewall 106 of patterned segment 102 by distance 132. Distance 132 can be controlled so as to reduce a size of dip 130 formed in conformal layer 126, which is subsequently formed over conformal layer 112 and patterned segment 120. Distance 132 can be less than or equal to width 128 of conformal layer 126 plus thickness 113 of conformal layer 112. Sidewall 122 of patterned segment 120 is separated from sidewall 114 of depression 118 by gap 124, which has width 134. For example, patterned segment 120 can comprise a metal, such as tungsten, and can be formed by appropriately depositing, patterning, and etching a layer of metal. At step 208, conformal layer 126 is formed over patterned segment 120, conformal layer 112, and gap 124, where the size of dip 130 in a portion of conformal layer 126 formed over gap 124 is determined by distance 132. For example, conformal layer 126 can comprise silicon oxide and can be formed by using a CVD or other suitable deposition process. By controlling distance 132 so as to reduce width 134 of gap 124, the size of dip 130 can be reduced, thereby reducing the effect of the vertical step caused by sidewall 106 of patterned segment 102 in structure 100.

Figure 3A:
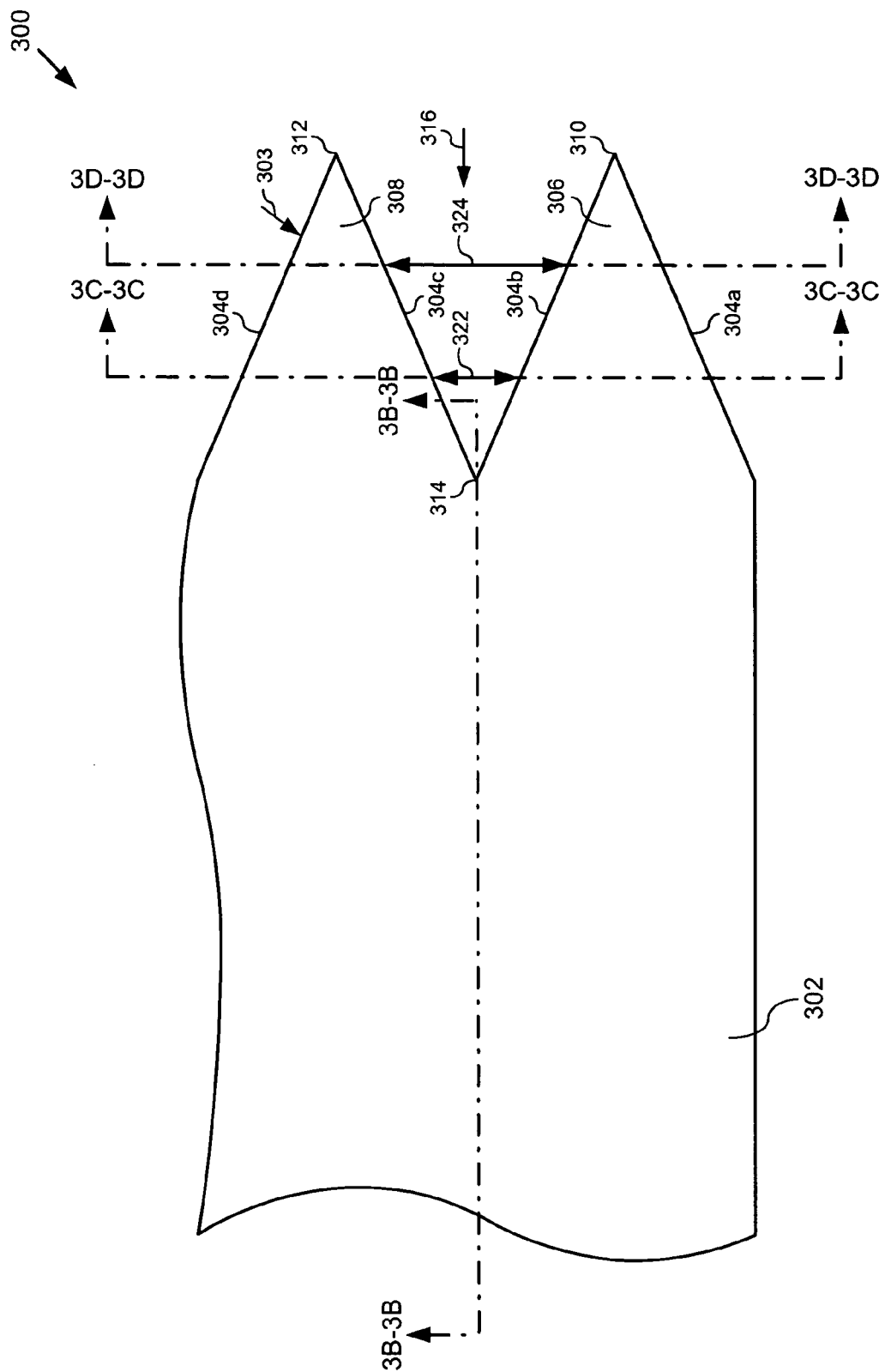
FIG. 3A illustrates a top view of an exemplary semiconductor structure in accordance with one embodiment of the present invention.
Figure 3B:
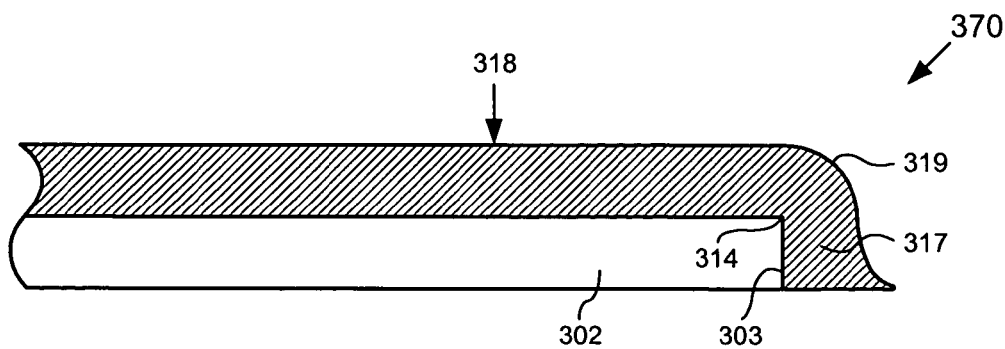
FIG. 3B illustrates a cross-sectional view of the exemplary structure of FIG. 3A after deposition of a conformal layer.
Figure 3C:
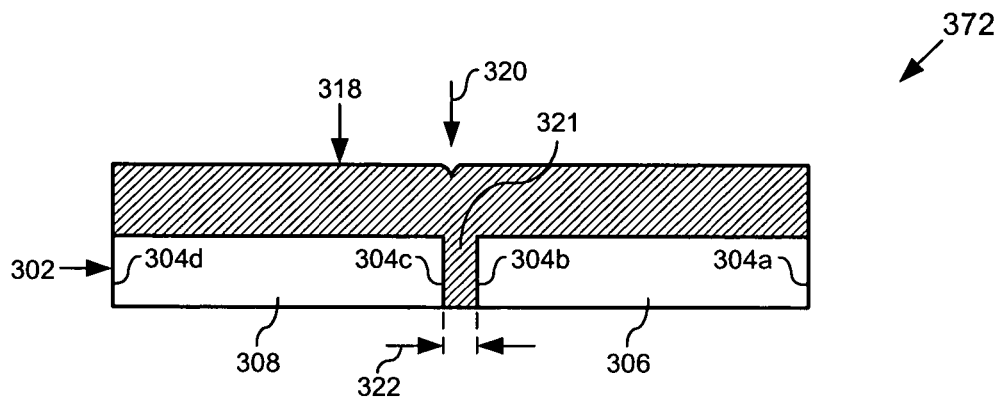
FIG. 3C illustrates a cross-sectional view of the exemplary structure of FIG. 3A after deposition of a conformal layer.
Figure 3D:
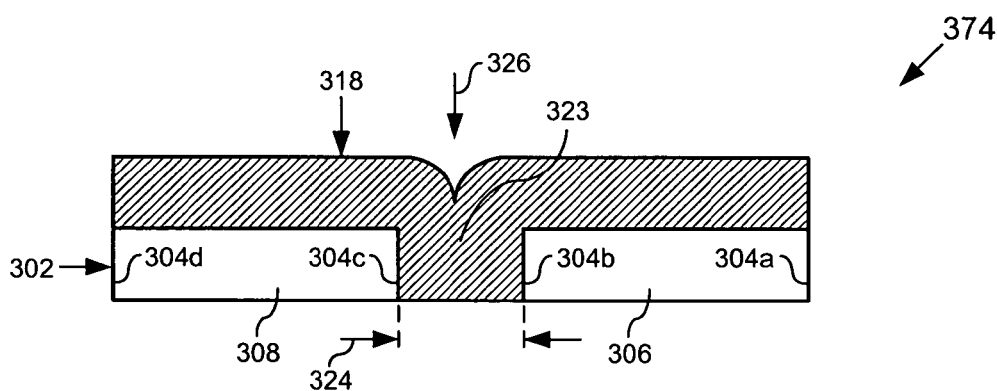
FIG. 3D illustrates a cross-sectional view of the exemplary structure of FIG. 3A after deposition of a conformal layer.

FIG. 3A shows a top view of an exemplary structure including an exemplary patterned segment in accordance with one embodiment of the present invention. FIG. 3A shows structure 300, which is a semiconductor structure, prior to deposition of a conformal layer, which is shown in FIGS. 3B, 3C, and 3D. Structure 300 includes patterned segment 302, which is situated over a semiconductor substrate (not shown in FIG. 3A). Structure 300 can be, for example, a semiconductor structure in a bulk acoustic wave device.

As shown in FIG. 3A, patterned segment 302 has sidewall 303, which includes sidewall segments 304a, 304b, 304c, and 304d (hereinafter "sidewall segments 304a through 304d"), protrusions 306 and 308, outer vertices 310 and 312, and inner vertex 314. Patterned segment 302 can comprise a metal, such as tungsten. However, patterned segment 302 can also comprise a suitable metal other than tungsten. Patterned segment 302 can be formed, for example, by depositing a layer of metal by using a PVD process or other suitable deposition processes. The layer of metal can then be patterned by using a photolithographic process and a suitable etch process, such as a dry etch process.

As shown in FIG. 3A, sidewall 303 of patterned segment 302 includes protrusions 306 and 308, which are situated adjacent to each other. Also shown in FIG. 3A, protrusion 306 comprises sidewall segments 304a and 304b and protrusion 308 comprises sidewall segments 304c and 304d. In the present embodiment, protrusions 306 and 308 of patterned segment 302 each have a triangular shape. In other embodiments, patterned segment 302 can comprise a number of protrusions, where each protrusion has a shape other than a triangular shape. It is noted that although only protrusions 306 and 308 are shown in FIG. 3A to preserve brevity, sidewall 303 of patterned segment 302 may include many protrusions, such as protrusions 306 and 308.

As also shown in FIG. 3A, collection region 316 is situated between protrusions 306 and 308. Collection region 316 is partially enclosed by sidewall segments 304b and 304c and has a triangular shape, which is determined by the shape of protrusions 306 and 308. As shown in FIG. 3A, sidewall segments 304b and 304c are separated by different separation distances, such as separation distances 322 and 324, which progressively increase as sidewalls 304b and 304c extend from vertex 314 to respective vertices 310 and 312.

Thus, separation distance 324, which is closer to vertices 310 and 312 in relation to separation 322, is greater than separation distance 322. This configuration allows a portion of a conformal layer that is subsequently deposited over patterned segment 302 to collect in collection region 316. The portion of the conformal layer (not shown in FIG. 3A) that can collect in collection region 316 can advantageously reduce the undesirable effect of the vertical step formed by sidewall 303 of patterned segment 302 in structure 300. The effect of collection region 316 on a conformal layer that is deposited over patterned segment 302 will be discussed below in relation to FIGS. 3B, 3C, and 3D.

FIG. 3B shows a cross-sectional view of structure 300 across line 3B-3B in FIG. 3A after deposition of a conformal layer. In particular, patterned segment 302, sidewall 303, and inner vertex 314 correspond to the same elements in FIG. 3A and FIG. 3B. Structure 370 includes patterned segment 302 and conformal layer 318. As shown in FIG. 3B, conformal layer 318 is situated over patterned segment 302 and can comprise silicon oxide or other suitable dielectric material. Conformal layer 318 can be formed, for example, by depositing a layer of silicon oxide over patterned segment 302 by using a CVD process or other suitable deposition processes.

As further shown in FIG. 3B, portion 317 of conformal layer 318 is situated in collection region 316 (shown in FIG. 3A) adjacent to inner vertex 314 of patterned segment 302. As a result of the close proximity of sidewall segments 304b and 304c (shown in FIG. 3A) of sidewall 303 in the portion of collection region 316 (shown in FIG. 3A) adjacent to inner vertex 314, portion 317 of conformal layer 318 collects in collection region 316 (shown in FIG. 3A) and causes conformal layer 318 to have rounded corner 319 over the vertical step formed by sidewall 303. Thus, by providing a collection region adjacent to a vertical step formed in a patterned layer, the present invention significantly reduces the effect of the vertical step on a conformal layer deposited over the patterned layer.

FIG. 3C shows a cross-sectional view of structure 300 across line 3C-3C in FIG. 3A after deposition of a conformal layer. In particular, protrusions 306 and 308, sidewalls 304a through 304d, and separation distance 322 correspond to the same elements in FIG. 3A and FIG. 3C. As shown in FIG. 3C, in structure 372, conformal layer 318 is situated over protrusions 306 and 308 and can comprise silicon oxide or other suitable dielectric material. Conformal layer 318 can be formed, for example, by depositing a layer of silicon oxide over patterned segment 302 by using a CVD process or other suitable deposition processes. Conformal layer 318 includes dip 320, which is formed in conformal layer 320 as a result of vertical steps formed by sidewall segments 304b and 304c of patterned segment 302.

As further shown in FIG. 3C, portion 321 of conformal layer 318 is situated in collection region 316 (shown in FIG. 3A) between sidewall segments 304b and 304c of patterned layer 302 at separation distance 322. As a result of the proximity of sidewall segments 304b and 304c (shown in FIG. 3A) of sidewall 303, portion 321 of conformal layer 318 collects in collection region 316 (shown in FIG. 3A) and causes dip 320 to have a reduced size. Thus, the triangular shape of collection region 316, which determines the proximity of sidewall segments 304b and 304c, significantly reduces the size of dip 320 by minimizing the separation distance between sidewalls 304b and 304c near vertex 314 (shown in FIG. 3A). As such, the effect of the vertical step formed by sidewall 303 of patterned segment 302 (shown in FIG. 3A) near vertex 314 on conformal layer 318 is significantly reduced.

FIG. 3D shows a cross-sectional view of structure 300 across line 3D-3D in FIG. 3D after deposition of a conformal layer. In particular, protrusions 306 and 308, sidewalls 304a through 304d, and separation distance 324 correspond to the same elements in FIG. 3A and FIG. 3D. As shown in FIG. 3D, in structure 374, conformal layer 318 is situated over protrusions 306 and 308 and can comprise silicon oxide or other suitable dielectric material. Conformal layer 318 can be formed, for example, by depositing a layer of silicon oxide over patterned layer 302 by using a CVD process or other suitable deposition processes. Conformal layer 318 includes dip 326, which is formed in conformal layer 320 as a result of vertical steps formed by sidewall segments 304b and 304c of patterned segment 302.

As further shown in FIG. 3D, portion 323 of conformal layer 318 is situated in collection region 316 (shown in FIG. 3A) between sidewall segments 304b and 304c of patterned layer 302 at separation distance 324. As the separation distances between sidewalls 304b and 304c gradually increase in collection region 316 (shown in FIG. 3A) as a result of the triangular shape of collection region 316, the size of the dip formed in conformal layer 318, such as dip 326, also gradually increases. For example, dip 326, which is formed in conformal layer 318 at separation distance 324, is larger than dip 320, which is formed in conformal layer 318 at separation distance 322, because separation distance 324 is greater than separation distance 322. As a result, the effect of the vertical step formed by sidewall 303 (shown in FIG. 3A) is gradually reduced by collection region 316, which causes conformal layer 318 to have a smoother topography over sidewall 303 (shown in FIG. 3A) at least in the center of the collection region.

As discussed above, in the embodiment of the invention in FIG. 1, the effect of vertical steps in a multilayer semiconductor structure are advantageously reduced by appropriately controlling the distance between patterned segments in the multilayer semiconductor structure to reduce the size of a dip formed in a conformal layer situated over the vertical steps. As also discussed above, in the embodiment of the invention in FIGS. 3A, 3B, 3C, and 3D, a number of protrusions having a triangular shape are formed in a sidewall of a patterned segment in a semiconductor structure such that a triangular-shaped collection region is formed between adjacent protrusions. The triangular-shaped collection region collects a portion of a conformal layer deposited over the patterned segment to collect, which advantageously reduces the effect on the conformal layer of the vertical step formed by the sidewall of the patterned segment.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a method and structure for reducing the effect of vertical steps in patterned layers in semiconductor structures have been described.

The invention claimed is:

1. A method for fabricating a multilayer semiconductor structure, said method comprising steps of:
    forming first and second patterned segments, a sidewall of said first patterned segment that faces a sidewall of said second patterned segment being separated from said sidewall of said second patterned segment by a first gap;
    forming a first conformal layer over said first and second patterned segments and said first gap, said first conformal layer being in direct contact with said first and second patterned segments without any intervening layer therebetween, said first conformal layer forming a depression having substantially vertical sidewalls over said first gap;
    forming a third patterned segment in said depression having said substantially vertical sidewalls such that a sidewall of said third patterned segment is separated from a substantially vertical sidewall of said depression by a second gap; and
    forming a second conformal layer over said first conformal layer, said third patterned segment, and said second gap, a dip being formed in said second conformal layer over said second gap;
    wherein said step of forming said third patterned segment includes forming said third patterned segment at a location in said depression having said substantially vertical sidewalls so that said sidewall of said third patterned segment that faces said sidewall of said first patterned segment is laterally separated from said sidewall of said first patterned segment by a distance that is less than or equal to a thickness of a sum of said first and second conformal layers to reduce a size of said dip in said second conformal layer.

2. The method of claim 1 wherein said step of forming said third patterned segment further includes forming said third patterned segment at a location in said depression that minimizes a width of said second gap.

3. The method of claim 1 wherein said first, second, and third patterned segments comprise a metal.

4. The method of claim 3 wherein said metal comprises tungsten.

5. The method of claim 1 wherein said first and second conformal layers comprise a dielectric material.

6. The method of claim 5 wherein said dielectric material comprises silicon oxide.

7. A method for fabricating a multilayer semiconductor structure, said method comprising steps of:
    forming first and second patterned segments, a sidewall of said first patterned segment that faces a sidewall of said second patterned segment being separated from said sidewall of said second patterned segment by a first gap;
    forming a first conformal layer over said first and second patterned segments and said first gap, said first conformal layer being in direct contact with said first and second patterned segments without any intervening layer therebetween, said first conformal layer forming a depression having substantially vertical sidewalls over said first gap;
    forming a third patterned segment in said depression having said substantially vertical sidewalls, a sidewall of said third patterned segment being disposed in said depression and facing said sidewall of said first patterned segment;
    forming a second conformal layer over said first conformal layer;
    wherein said step of forming said third patterned segment includes forming said third patterned segment at a location in said depression having said substantially vertical sidewalls so that said sidewall of said third patterned segment is laterally separated from said sidewall of said first patterned segment by a distance that is less than or equal to a thickness of a sum of said first and second conformal layers to reduce a size of a dip in said second conformal layer.

8. The method of claim 7 wherein said first patterned segment comprises a metal.

9. The method of claim 7 wherein said second patterned segment comprises a metal.

10. The method of claim 7 wherein said third patterned segment comprises a metal.

11. The method of claim 8 wherein said metal comprises tungsten.

12. The method of claim 9 wherein said metal comprises tungsten.

13. The method of claim 10 wherein said metal comprises tungsten.

14. The method of claim 7 wherein said first conformal layer comprises a dielectric material.

15. The method of claim 14 wherein said dielectric material comprises silicon oxide.

16. The method of claim 7 wherein said second conformal layer comprises a dielectric material.

17. The method of claim 16 wherein said dielectric material comprises silicon oxide.

* * * * *